(12) United States Patent
Balasubramanyam et al.

(10) Patent No.: US 8,377,213 B2
(45) Date of Patent: Feb. 19, 2013

(54) SLIT VALVE HAVING INCREASED FLOW UNIFORMITY

(75) Inventors: Chandrasekhar Balasubramanyam, Bangalore (IN); Helder Lee, San Jose, CA (US); Miriam Schwartz, Los Gatos, CA (US); Elizabeth Wu, San Jose, CA (US); Kedarnath Sangam, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1325 days.

(21) Appl. No.: 12/114,927

(22) Filed: May 5, 2008

(65) Prior Publication Data

US 2009/0272324 A1 Nov. 5, 2009

(51) Int. Cl.
*C23C 16/00* (2006.01)

(52) U.S. Cl. .................. 118/733; 118/719; 156/345.31; 156/345.32; 251/193

(58) Field of Classification Search .................. 118/733
See application file for complete search history.

(56) References Cited

U.S. PATENT DOCUMENTS

| | | | |
|---|---|---|---|
| 5,639,334 A | | 6/1997 | Canale et al. |
| 5,704,981 A | * | 1/1998 | Kawakami et al. ........... 118/715 |
| 6,045,620 A | | 4/2000 | Tepman et al. |
| 6,302,964 B1 | | 10/2001 | Umotoy et al. |
| 7,086,638 B2 | | 8/2006 | Kurita et al. |
| 7,159,846 B2 | | 1/2007 | Aggarwal et al. |
| 2004/0082251 A1 | | 4/2004 | Bach et al. |
| 2004/0154538 A1 | * | 8/2004 | Carpenter et al. ............ 118/719 |

FOREIGN PATENT DOCUMENTS

KR 10-0703650 B1 4/2007

OTHER PUBLICATIONS

International Search Report and Written Opinion mailed Dec. 4, 2009 for Application No. PCT/US2009/042688.

* cited by examiner

*Primary Examiner* — Parviz Hassanzadeh
*Assistant Examiner* — Nathan K Ford
(74) *Attorney, Agent, or Firm* — Moser Taboada; Alan Taboada

(57) ABSTRACT

Methods and apparatus for increasing flow uniformity are provided herein. In some embodiments, a slit valve having increased flow uniformity may be provided, the slit valve may include a housing having an opening disposed therethrough, the opening configured to allow a substrate to pass therethrough; a gas inlet formed in the housing; an outer plenum disposed in the housing and coupled to the gas inlet; an inner plenum disposed in the housing and coupled to the outer plenum via a plurality of holes; and a plurality of gas outlets disposed in the housing and fluidly coupling the opening to the inner plenum.

15 Claims, 3 Drawing Sheets

SLIT VALVE HAVING INCREASED FLOW UNIFORMITY

BACKGROUND OF THE INVENTION

1. Field of the Invention

Embodiments of the present invention generally relate to semiconductor processing.

2. Description of the Related Art

As the demand for semiconductor devices continues to grow, there is a constant need to increase manufacturing throughput without sacrificing device quality. Some methods include an apparatus for treating, and/or cleaning the semiconductor wafer as it is passed into a vacuum transfer chamber and/or a semiconductor process chamber. Such methods include passing the wafer through a curtain of a process gas or gases as it is transferred into a semiconductor process chamber. These methods can reduce the processing time for manufacturing a semiconductor device.

However, conventional apparatus used to perform these methods do not uniformly treat and/or clean the surface of the substrate. This uneven treatment, and/or cleaning of the substrate surface can result in poorly fabricated semiconductor devices that may not function properly.

Thus, there is a need for an improved apparatus for treating, and/or cleaning the surface of semiconductor substrates more uniformly.

SUMMARY

Methods and apparatus for increasing flow uniformity are provided herein. In some embodiments, a slit valve having increased flow uniformity may be provided, the slit valve may include a housing having an opening disposed therethrough, the opening configured to allow a substrate to pass therethrough; a gas inlet formed in the housing; an outer plenum disposed in the housing and coupled to the gas inlet; an inner plenum disposed in the housing and coupled to the outer plenum via a plurality of holes; and a plurality of gas outlets disposed in the housing and fluidly coupling the opening to the inner plenum.

In some embodiments, a slit valve may include a housing having an opening disposed therethrough, the opening configured to allow a substrate to pass therethrough; a gas inlet formed in the housing; a plenum disposed in the housing and coupled to the gas inlet; a plurality of gas outlets disposed in the housing and fluidly coupling the opening to the plenum; and a counterbore disposed on a plenum side of one or more of the gas outlets.

In some embodiments, an apparatus for processing a substrate may include a process chamber; and a slit valve coupled to the process chamber, the slit valve including a housing having an opening disposed therethrough, the opening configured to allow a substrate to pass therethrough; a gas inlet formed in the housing; an outer plenum disposed in the housing and coupled to the gas inlet; an inner plenum disposed in the housing and coupled to the outer plenum via a plurality of holes; and a plurality of gas outlets disposed in the housing and fluidly coupling the opening to the inner plenum.

In some embodiments, an apparatus for processing a substrate may include a process chamber; and a slit valve coupled to the process chamber, the slit valve including a housing having an opening disposed therethrough, the opening configured to allow a substrate to pass therethrough; a gas inlet formed in the housing; a plenum disposed in the housing and coupled to the gas inlet; a plurality of gas outlets disposed in the housing and fluidly coupling the opening to the plenum; and a counterbore disposed on a plenum side of one or more of the gas outlets.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
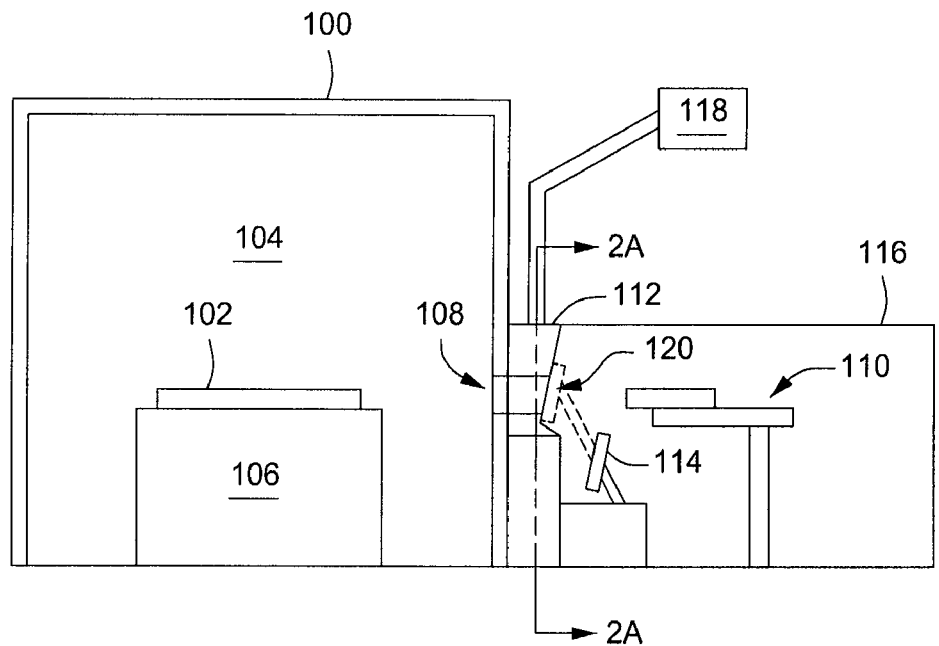
FIG. 1 illustrates an apparatus in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide methods and apparatus for providing more uniform gas distribution and/or flow through an opening. In some embodiments, a slit valve suitable for treating a substrate as the substrate is transferred into a process chamber via a slit valve opening is provided. In some embodiments, the slit valves may advantageously be configured to more uniformly impinge one or more gases upon a surface of a substrate passing through the slit valve opening.

Embodiments of slit valves in accordance with the present invention may be utilized in any process chamber where it is desired to treat a substrate as it passes into or out of the process chamber. For example, suitable process chambers may include semiconductor substrate process chambers, vacuum processing chambers, thermal processing chambers, plasma processing chambers, annealing chambers, or the like. Examples of suitable chambers include the CENTURA chamber, and the RP EPI chamber, respectively, as well as other chambers, all available from Applied Materials, Inc. of Santa Clara, Calif. Other chambers may also suitably use the inventive slit valves.

As a non-limiting, illustrative example, FIG. 1 illustrates a process chamber 100 coupled to a transfer chamber 116 via a slit valve 112 in accordance with some embodiments of the present invention. The process chamber 100 may be any suitable process chamber, as discussed above. An exemplary process chamber 100 may include an inner volume 104 having a substrate support pedestal 106 disposed therein for supporting a substrate 102 thereupon. Optionally, the process chamber 100 may include various other components (not shown) suitable for the particular process to be performed within the process chamber 100, such as one or more a gas inlets for delivering a process gas or gases to the inner volume 104, plasma generating apparatus, heating apparatus (such as lasers, heat lamps, resistive heaters, or the like), pumping apparatus for generating and maintaining a desired pressure within the process chamber 100, and the like.

The process chamber 100 may further include an opening 108 sized to facilitate passing the substrate 102 therethrough by a substrate transfer device 110 during operation. The transfer device 110 may include a substrate transfer robot such as those commonly found in load lock chambers and vacuum transfer chambers.

The transfer chamber 116 may be a vacuum transfer chamber, a load lock chamber, a factory interface, or any other suitable chamber useful for transferring a substrate to or from the process chamber 100. Alternatively, in some embodiments, the transfer chamber 116 may be omitted.

The slit valve may be disposed between the process chamber 100 and the transfer chamber 116 proximate the opening 108 in the process chamber 100. The slit valve 112 has a slit valve opening 120 generally configured to align with the opening 108 and facilitate passing the substrate 102 between the process chamber 100 and the transfer chamber 116. A door 114 may be provided to selectively open and close the slit valve 112 and thereby provide access to or isolate the inner volume 104 of the process chamber 100, for example, to place a substrate 102 on the pedestal 106.

The slit valve 112 may be coupled to a gas source 118 for providing one or more gases for treating the substrate 102 as it passes through the slit valve opening 120 during operation. The one or more gases may be any suitable gas or gases for treating the substrate as desired in a particular application.

In some embodiments, the slit valve may include an inlet for coupling to the gas source 118 and a plurality of outlets distributed across the slit valve opening 120 in a configuration designed to provide a uniform gas flow. One or more plenums may be provided between the inlet and the plurality of outlets to facilitate control over the flow of the gas(es) out of the plurality of outlets. In some embodiments, the geometry of the one or more plenums may be configured to control the flow of the gas(es) as desired. In some embodiments, the geometry of the plurality of outlets may be configured to control the flow of the gas(es) as desired.

Figure 2A:
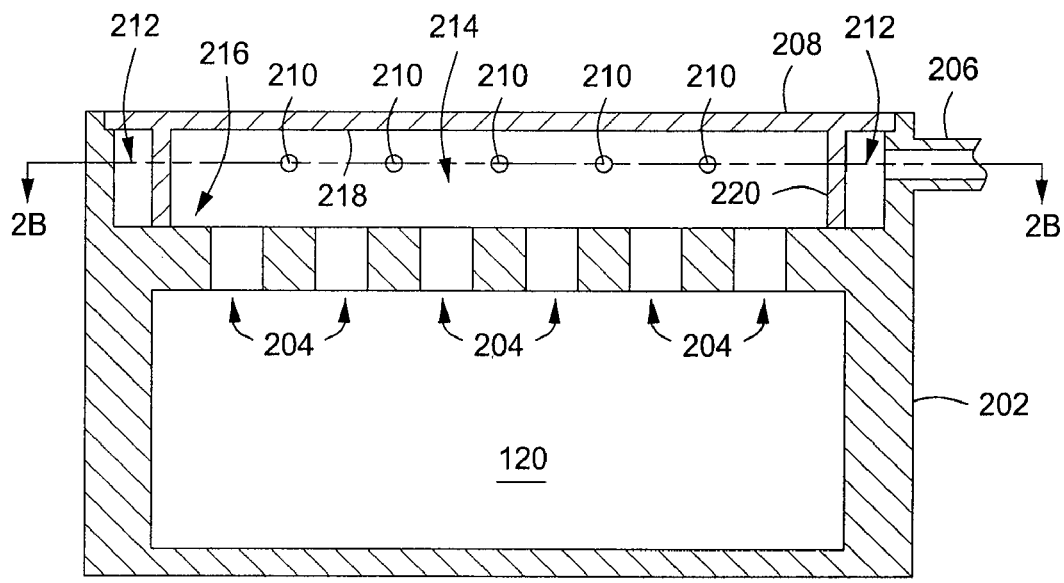
FIGS. 2A-C illustrate a cross sectional view of a slit valve in accordance with some embodiments of the present invention.
Figure 2B:
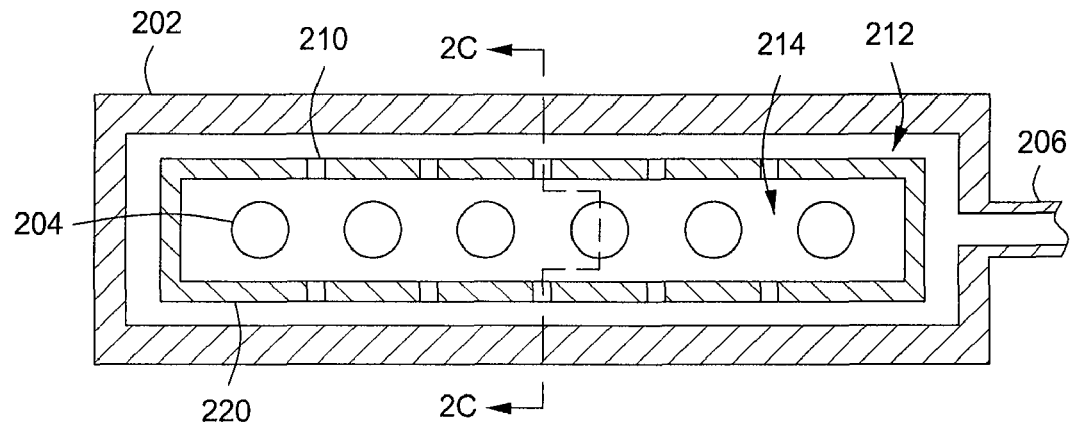
Figure 2C:
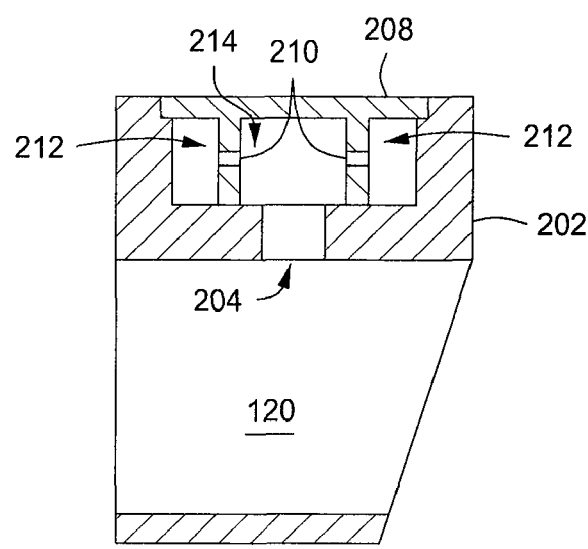

For example, a cross sectional view of a slit valve in accordance with some embodiments of the present invention is illustrated in FIGS. 2A-C. As shown in FIG. 2A, the slit valve may include a housing 202 having an opening 120 disposed therethrough. A gas inlet 206 may be provided in the housing 202 for coupling the slit valve to a gas source (such as gas source 118 shown in FIG. 1). The gas inlet 206 may be fluidly coupled to a first plenum 212 in the housing 202. A second plenum 214 in the housing 202 is coupled to the first plenum 212 via a plurality of holes 210. A plurality of gas outlets 204 may be provided for coupling the second plenum 214 to the opening 120. The plurality of gas outlets 204 are arranged to provide a flow of gas to a surface of a substrate passing through the opening 120.

In some embodiments, the first plenum 212 and the second plenum 214 may be at least partially defined within the housing 202 by an insert 208 configured to fit at least partially within a recess 216 in the housing 202. The insert 208 may include a base 218 having walls 220 protruding therefrom. The walls 220 may be configured to engage a lower surface of the recess 216 to define the two plenums 212, 214 (e.g., the outer plenum 212 is defined between the walls 220 and the wall of the housing 202 bounding the recess 216, and the inner plenum 214 is defined within the walls 220 of the insert 208). In some embodiments, and as best shown in FIG. 2B, the outer plenum 212 may circumscribe the inner plenum 214.

The walls 220 may have the plurality of openings 210 contained therein to fluidly couple the outer and inner plenums 212, 214. The number, geometry, and arrangement of the plurality of holes 210 may be controlled as desired to control the flow of gas from the outer plenum 212 to the inner plenum 214. For example, in some embodiments, the holes 210 may be substantially equidistantly spaced from each other along each side of a wall separating the outer and inner plenums 212, 214 (e.g., the wall 220) to facilitate even distribution of gas pressure in the outer plenum. In some embodiments at least 2 holes 210 may be provided, or in some embodiments, up to about 50 holes 210 may be provided. The number of holes provided will vary depending upon the volume of the plenums, the desired flow requirements, and the like. As such, other numbers of holes may be utilized as needed for a particular application. The diameter of the holes 210 (or open area) may be defined to facilitate control over the rate of gas flow from the outer plenum 212 to the inner plenum 214. In some embodiments, the holes 210 may have a diameter of between about 0.01 inch to about 0.1 inches. It is contemplated that other diameters may be used in other applications having different plenum volumes or flow requirements.

The plurality of gas outlets 204 may be disposed within the area defining inner plenum 214. The number, geometry, total open area, and like characteristics of the gas outlets 204 may be selected as desired to facilitate control over the exit velocity of the gas flowing out of the inner plenum 214 and into the opening 120. In some embodiments, the gas outlets 204 may be offset from the location of the plurality of holes 210, thereby facilitating equalization of pressure and gas flow within the inner plenum 214. In some embodiments, the slit valve may include up to about 40 gas outlets 204. The gas outlets may be arranged in a single line, in multiple lines, or in any other two dimensional arrangement. The two dimensional arrangement may comprise of uniformly or non-uniformly spaced rows, aligned or staggered rows, or any random distribution of gas outlets. In some embodiments, between about 20 to about 40 gas outlets 204 may be arranged in a single line. In some embodiments, about 20 gas outlets 204 may be arranged in a single line.

In operation, a flow of one or more gases may be provided to the outer plenum 212 via the gas inlet 206. Due to the relatively small size of the holes 210, the gas will tend to fill and pressurize the outer plenum 212 prior to substantially entering the inner plenum 214. Thus, the gas pressure within the outer plenum 212 will be substantially even about the inner plenum 214. As such, the gas flowing into the inner plenum 214 through the holes 210 will also be entering at a relatively uniform, or even, rate, and the pressure within the inner plenum 214 will be substantially uniform. The gas provided to the slit valve will then flow out of the inner plenum 214 and into the opening 120 via the gas outlets 204. As the pressure within the inner plenum 214 is more uniform than if only a single plenum were provided with a single gas inlet, the exit velocity of the gas flowing out of the gas outlets 204 will be more uniform than in conventional apparatus. Thus, the arrangement of the first plenum 212 and the second plenum 214 may advantageously equalize the gas pressure proximate the plurality of gas outlets 204 to facilitate more uniform gas flow therethrough during operation. In some embodiments, the flow rate of gas exiting each gas outlet 204 may be controlled to be uniform to greater than about 70 percent, or in some embodiments, greater than about 80 percent, or in some embodiments, greater than about 90 percent, or in some embodiments, between about 90 to about 97 percent.

Figure 3A:
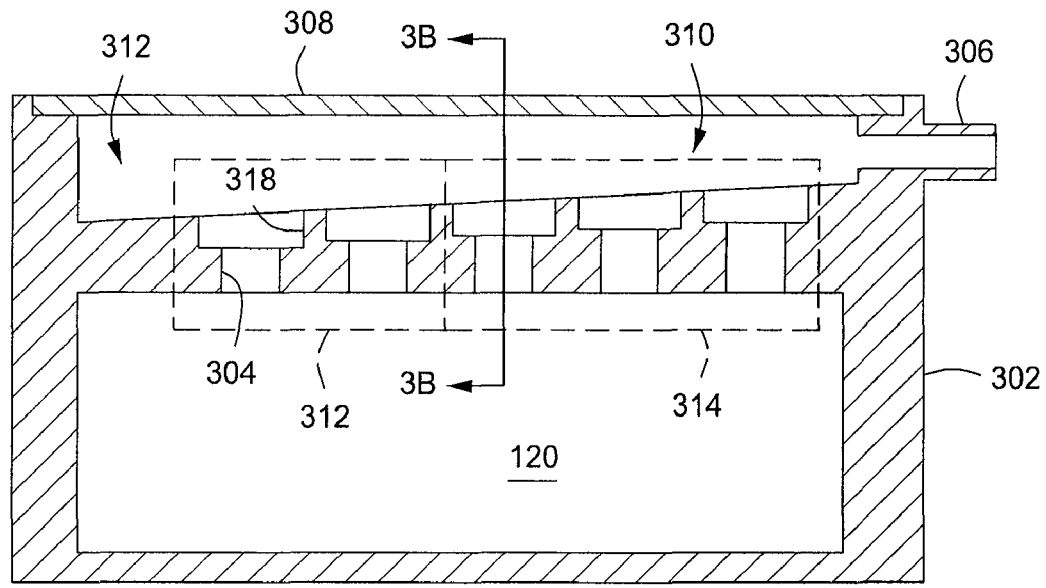
FIG. 3A-B illustrate a cross sectional view of a slit valve in accordance with some embodiments of the present invention.
Figure 3B:
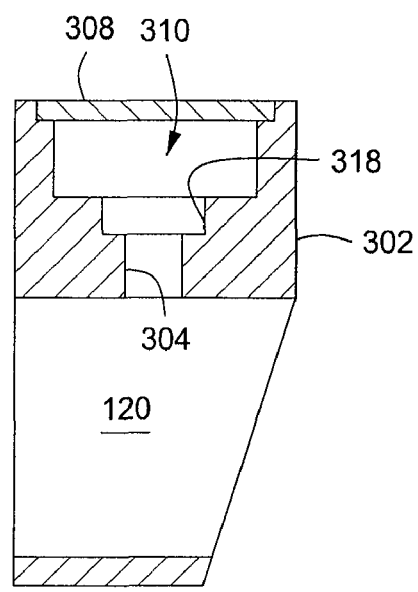

The slit valve described above with respect to FIGS. 2A-C is exemplary only, and other slit valves in accordance with the present invention are contemplated. For example, FIGS. 3A-B illustrate a cross-sectional view of a slit valve in accordance with some embodiments of the present invention. The slit valve includes a housing 302 having an opening 120 disposed therethrough. A plenum 310 is at least partially disposed within the housing 302. A gas inlet 306 may be disposed in the housing 302 for coupling the plenum 310 to a gas source (such as gas source 118 depicted in FIG. 1). A plurality of gas outlets 304 may be disposed in the housing for coupling the plenum 310 to the opening 120. In some embodiments, at least some of the plurality of gas outlets 304 may further include a counterbore 318 disposed proximate the plenum 310. For example, as shown in FIG. 3, each gas outlet 304 may have a counterbore 318 formed on the plenum-side of the outlet 304.

As discussed above with respect to FIGS. 2A-C, the number, size, and geometry of the plurality of gas outlets 304 (and the counterbores 318) may be controlled as desired to facilitate control over the exit velocity of the gas flowing into the opening 120. For example, in some embodiments, the slit valve may include about 20 gas outlets 304, or in some embodiments about 78 gas outlets 304, or in some embodiments about 96 gas outlets 304. In some embodiments, about 20 gas outlets may be provided in a single line. Alternatively, in some embodiments, about 78 or about 96 gas outlets may be provided in two rows, each row having about half of the total gas outlets.

While the embodiment depicted in FIGS. 3A-B shows counterbores 318 and gas outlets 304 that are circular, any such shapes which may facilitate a more uniform gas flow through the plurality of gas outlets 304 during operation may be used.

In some embodiments, the plenum 310 may be at least partially defined by a recess 312 of the housing 302. For example, in some embodiments, a cover, or plate 308 may be provided atop the recess to define the plenum 310.

The slit valve may be configured to provide one or more design features that urge the flow of the gas delivered to the plenum 310 to be distributed as desired (e.g., to provide a more uniform flow of the gas to the opening 120). For example, in some embodiments, the plenum 310 may have a volume that varies along a longitudinal length thereof. For example, the volume may increase along the longitudinal length of the plenum in a direction moving away from the gas inlet 306. In some embodiments, the volume of the plenum 310 may be controlled by providing the recess 312 with an inclined bottom surface (although any other suitable method may be utilized as well). The rate of change of the volume may be controlled as desired to facilitate moving the gas delivered to the plenum 310 along the length of the plenum 310 (e.g., towards the larger volume). For example, in some embodiments the bottom surface of the recess 312 may be inclined at a downward angle (away from the gas inlet 306) of up to about 10 degrees, or in some embodiments, about 5 degrees. It is believed that the larger volume facilitates providing a "path of least resistance" that helps reduce the exit velocity of the gas from gas outlets 304 proximate the gas inlet 306, thereby making the exit flow across the opening 120 more uniform as compared to conventional configurations.

Alternatively or in combination with the foregoing, in some embodiments, a volume of at least one counterbore 318 may be different than a volume of at least one other counterbore 318. In some embodiments, the volume of each counterbore 318 may vary along a distance proximate from the gas inlet 306. In some embodiments, the volume of each counterbore 318 may increase as an increasing function of the distance from the gas inlet 306. In some embodiments, the volume of each counterbore 318 may be a function of one or more of the plenum slope (e.g., the slope of the bottom of the recess 312) or the distance of the counterbore 318 relative to the gas inlet 306.

In some embodiments, the counterbores 318 and/or gas outlets 304 may be arranged into zones having one or more counterbores 318 and/or gas outlets 304 per zone. Each zone, such as zone 312 and zone 314 shown in FIG. 3A, includes one or more counterbores 318 and/or gas outlets 304 having the same volume. The volumes of the counterbores 318 and/or gas outlets 304 that comprise each zone may vary between other zones. In some embodiments, the volumes of the counterbores 318 and/or gas outlets 304 in each zone may increase between adjacent zones as a function of the distance of the zone from the gas inlet 306, thereby facilitating increased gas flow in zones more distant from the gas inlet 306. The zones may be similar or dissimilar in size. In some embodiments, three zones may be provided.

In some embodiments, combinations of the above features may be provided. For example, in some embodiments, a slit valve may be provided having a sloped plenum 310 whose volume increases in a direction moving away from the gas inlet 306. Up to about 96 gas outlets 304 may be provided, each having a counterbore 318. The gas outlets 304 may be substantially equidistantly spaced from each other. The gas outlets 304 may be arranged into three different zones. The diameter of the gas outlets 304 may increase from zone-to-zone in a direction moving away from the gas inlet 306. In any of the above embodiments, the flow rate of gas exiting each gas outlet 304 may be controlled to be uniform to greater than about 70 percent, or in some embodiments, greater than about 80 percent, or in some embodiments, greater than about 90 percent, or in some embodiments, between about 90 to about 97 percent.

Thus, methods and apparatus suitable for facilitating more uniform delivery of a gas or gases have been provided herein. The improved uniformity may be at least greater than about 70 percent, and, in some embodiments, up to about 97 percent. The slit valves may be configured in a two plenum arrangement wherein a gas flow may be equalized utilizing the two plenums. Alternatively, the slit valves may be configured having one plenum and a plurality of flow control features wherein the gas flow may be equalized by at least one of varying the cross section of the plenum along a longitudinal length, providing counterbores in the gas outlets, varying the cross sectional area of the counterbores and/or the gas outlets along a longitudinal length of the plenum, or combinations thereof.

While the foregoing is directed to embodiments of the present invention, other and further embodiments of the invention may be devised without departing from the basic scope thereof, and the scope thereof is determined by the claims that follow.

What is claimed is:

1. A slit valve, comprising:
   a housing having an opening disposed therethrough, the opening configured to allow a substrate to pass therethrough;
   a gas inlet formed in the housing;
   an outer plenum disposed in the housing and coupled to the gas inlet;
   an inner plenum disposed in the housing and coupled to the outer plenum via a plurality of holes; and
   a plurality of gas outlets disposed in the housing and fluidly coupling the opening to the inner plenum.

2. The slit valve of claim 1, wherein the outer plenum circumscribes the inner plenum.

3. The slit valve of claim 1, wherein the plurality of holes are substantially equidistantly distributed about a sidewall of the inner plenum.

4. The slit valve of claim 1, wherein the plurality of holes are offset from the plurality of gas outlets.

5. The slit valve of claim 1, wherein the plurality of gas outlets comprises about 20 gas outlets.

6. The slit valve of claim 1, wherein the plurality of holes are substantially equidistantly distributed about a sidewall of the inner plenum.

7. The slit valve of claim 1, wherein the plurality of holes are offset from the plurality of gas outlets.

8. The slit valve of claim 1, wherein the housing includes a recess disposed proximate the opening, wherein the inner and outer plenums are disposed within the recess.

9. The slit valve of claim 8, further comprising:
an insert disposed within the recess and having a base and a plurality of sidewalls extending from the base such that the inner plenum is disposed within the plurality of sidewalls and the outer plenum is disposed between the plurality of sidewalls of the insert and sidewalls of the recess, wherein the plurality of holes that couple the inner and outer plenums are disposed in the plurality of sidewalls of the insert.

10. The slit valve of claim 8, wherein the gas outlets are disposed within a lower surface of the recess between the opening and the inner plenum.

11. An apparatus for processing a substrate, comprising:
a process chamber; and
a slit valve coupled to the process chamber, the slit valve comprising:
a housing having an opening disposed therethrough, the opening configured to allow a substrate to pass therethrough;
a gas inlet formed in the housing;
an outer plenum disposed in the housing and coupled to the gas inlet;
an inner plenum disposed in the housing and coupled to the outer plenum via a plurality of holes; and
a plurality of gas outlets disposed in the housing and fluidly coupling the opening to the inner plenum.

12. The slit valve of claim 11, wherein the outer plenum circumscribes the inner plenum.

13. The slit valve of claim 11, wherein the housing includes a recess disposed proximate the opening, wherein the inner and outer plenums are disposed within the recess.

14. The slit valve of claim 13, further comprising:
an insert disposed within the recess and having a base and a plurality of sidewalls extending from the base such that the inner plenum is disposed within the plurality of sidewalls and the outer plenum is disposed between the plurality of sidewalls of the insert and sidewalls of the recess.

15. The slit valve of claim 13, wherein the gas outlets are disposed within a lower surface of the recess between the opening and the inner plenum.

* * * * *

UNITED STATES PATENT AND TRADEMARK OFFICE
CERTIFICATE OF CORRECTION

PATENT NO. : 8,377,213 B2  
APPLICATION NO. : 12/114927  
DATED : February 19, 2013  
INVENTOR(S) : Chandrasekhar Balasubramanyam et al.

Page 1 of 1

It is certified that error appears in the above-identified patent and that said Letters Patent is hereby corrected as shown below:

In the Claims

In column 7, line 8, delete "slit valve" and substitute therefor --apparatus--;
line 11, delete "slit valve" and substitute therefor --apparatus--;

In column 7, line 8, delete "1" and substitute therefor --11--;
line 11, delete "1" and substitute therefor --11--;

In column 8, line 13, delete "slit valve" and substitute therefor --apparatus--;
line 15, delete "slit valve" and substitute therefor --apparatus--;
line 18, delete "slit valve" and substitute therefor --apparatus--;
line 25, delete "slit valve" and substitute therefor --apparatus--;

Signed and Sealed this
Third Day of December, 2013

Margaret A. Focarino
*Commissioner for Patents of the United States Patent and Trademark Office*